United States Patent
Huang et al.

(10) Patent No.: US 9,287,179 B2
(45) Date of Patent: Mar. 15, 2016

(54) COMPOSITE DUMMY GATE WITH CONFORMAL POLYSILICON LAYER FOR FINFET DEVICE

(75) Inventors: Yuan-Sheng Huang, Taichung (TW); Tzu-Yen Hsieh, Taipei (TW); Ming-Ching Chang, Hsinchu (TW); Chao-Cheng Chen, Shin-Chu (TW); Chia-Jen Chen, Chiayi (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/353,975

(22) Filed: Jan. 19, 2012

(65) Prior Publication Data

US 2013/0187235 A1    Jul. 25, 2013

(51) Int. Cl.
| | |
|---|---|
| *H01L 29/78* | (2006.01) |
| *H01L 21/8238* | (2006.01) |
| *H01L 29/66* | (2006.01) |
| *H01L 27/092* | (2006.01) |

(52) U.S. Cl.
CPC .... *H01L 21/823821* (2013.01); *H01L 27/0924* (2013.01); *H01L 29/66795* (2013.01); *H01L 29/785* (2013.01)

(58) Field of Classification Search
CPC ............... H01L 21/823821; H01L 27/0924; H01L 29/66795; H01L 29/785
USPC ........................ 257/341–342, 347, 369, 412
See application file for complete search history.

(56) References Cited

U.S. PATENT DOCUMENTS

| | | | |
|---|---|---|---|
| 7,268,396 B2 * | 9/2007 | Lee et al. ........................ | 257/347 |
| 7,915,112 B2 | 3/2011 | Xu et al. | |
| 8,119,473 B2 * | 2/2012 | Huang et al. ................... | 438/199 |
| 8,202,768 B2 * | 6/2012 | Lander ............................ | 438/149 |
| 2004/0150071 A1 * | 8/2004 | Kondo et al. ................... | 257/623 |
| 2007/0090443 A1 * | 4/2007 | Choi et al. ....................... | 257/314 |
| 2008/0171408 A1 * | 7/2008 | Zhu et al. ........................ | 438/157 |
| 2011/0089493 A1 * | 4/2011 | Lander ............................ | 257/347 |
| 2011/0147840 A1 * | 6/2011 | Cea et al. ........................ | 257/347 |
| 2011/0156166 A1 * | 6/2011 | Huang et al. ................... | 257/392 |
| 2011/0278676 A1 * | 11/2011 | Cheng et al. .................... | 257/369 |
| 2012/0001266 A1 * | 1/2012 | Lim et al. ........................ | 257/369 |
| 2012/0018813 A1 * | 1/2012 | Holmes et al. ................. | 257/392 |
| 2012/0132989 A1 * | 5/2012 | Haensch et al. ............... | 257/347 |
| 2013/0075818 A1 * | 3/2013 | Lee et al. ........................ | 257/347 |

* cited by examiner

*Primary Examiner* — Mohsen Ahmadi
*Assistant Examiner* — Frederick B Hargrove
(74) *Attorney, Agent, or Firm* — Haynes and Boone, LLP (57) ABSTRACT

The present disclosure involves a FinFET. The FinFET includes a fin structure formed over a substrate. A gate dielectric layer is least partially wrapped around a segment of the fin structure. The gate dielectric layer contains a high-k gate dielectric material. The FinFET includes a polysilicon layer conformally formed on the gate dielectric layer. The FinFET includes a metal gate electrode layer formed over the polysilicon layer. The present disclosure provides a method of fabricating a FinFET. The method includes providing a fin structure containing a semiconductor material. The method includes forming a gate dielectric layer over the fin structure, the gate dielectric layer being at least partially wrapped around the fin structure. The method includes forming a polysilicon layer over the gate dielectric layer, wherein the polysilicon layer is formed in a conformal manner. The method includes forming a dummy gate layer over the polysilicon layer.

20 Claims, 10 Drawing Sheets

COMPOSITE DUMMY GATE WITH CONFORMAL POLYSILICON LAYER FOR FINFET DEVICE

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

As the scaling down progression takes place, challenges from both fabrication and design issues have resulted in the development of three-dimensional designs, such as fin-like field effect transistor (FinFET) device. A typical FinFET device is fabricated with a thin "fin" (or fin-like structure) extending from a substrate. The fin usually includes silicon and forms the body of the transistor device. The channel of the transistor is formed in this vertical fin. A gate is provided over (e.g., wrapping around) the fin. This type of gate allows greater control of the channel. Other advantages of FinFET devices include reduced short channel effect and higher current flow. However, conventional processes used to fabricate the gate for the FinFET devices may result in undesirable gate compositions.

Therefore, while existing methods of fabricating FinFET devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the terms "top," "bottom," "under," "over," and the like are used for convenience and are not meant to limit the scope of embodiments to any particular orientation. Various features may also be arbitrarily drawn in different scales for the sake of simplicity and clarity. In addition, the present disclosure may repeat reference numerals and/or letters in the various examples. This repetition is for the purpose of simplicity and clarity and does not in itself necessarily dictate a relationship between the various embodiments and/or configurations discussed.

Figure 1:
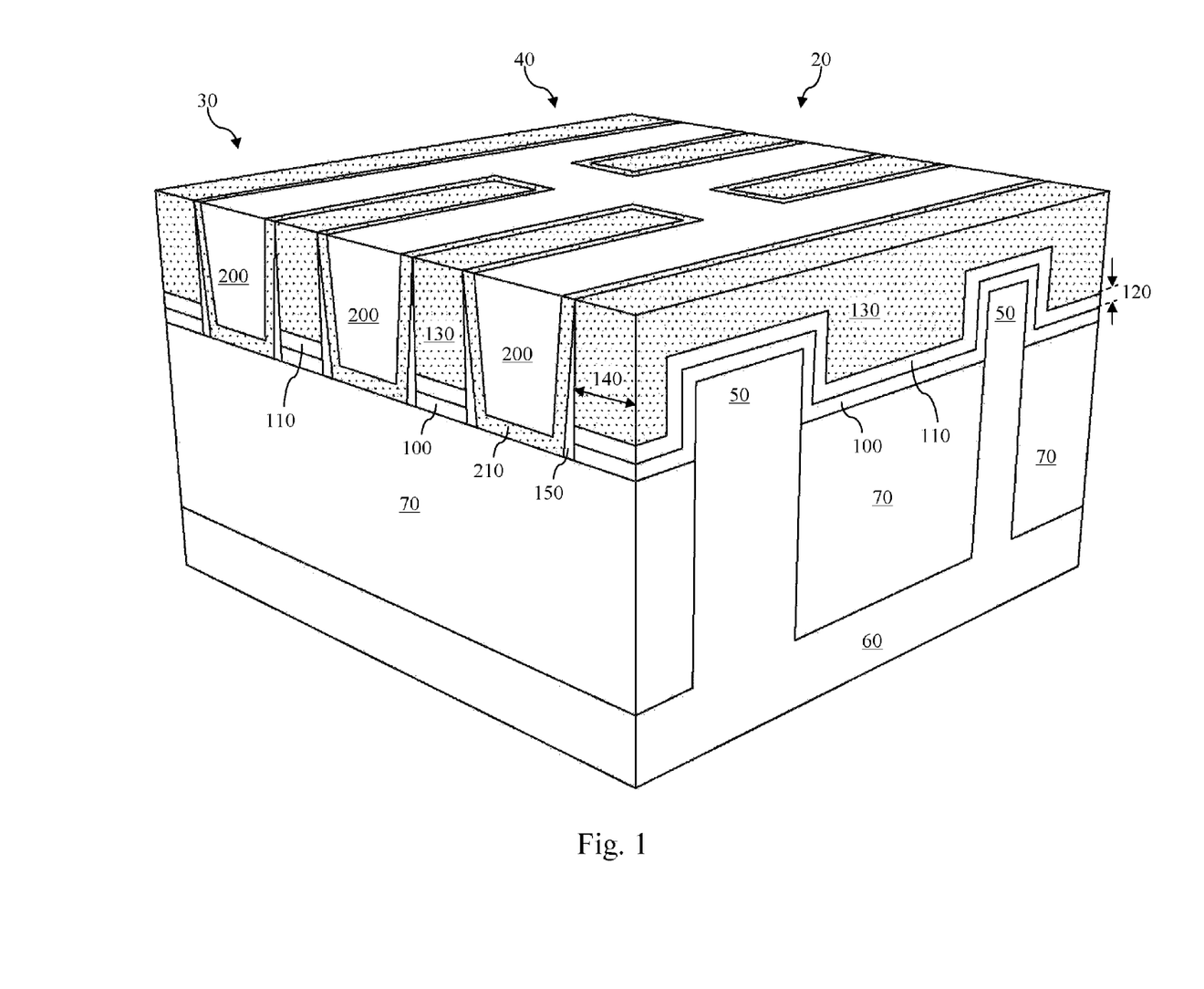
FIGS. 1 to 9 illustrate fragmentary three-dimensional perspective views of a FinFET device at various stages of fabrication according to the method of FIG. 1.

The use of FinFET devices has been gaining popularity in the semiconductor industry. Referring to FIG. 1, a diagrammatic fragmentary three dimensional view of a FinFET device 20 is illustrated. The FinFET device 20 includes a plurality of non-planar multi-gate transistors that are built on a substrate. In the embodiment illustrated, the FinFET device 20 includes an nFET device 30 and a pFET device 40. The nFET device 30 and the pFET device 40 each contain a thin silicon "fin-like" structure (referred to as fin) that forms the body of the nFET device 30 or the pFET device 40. A gate of the nFET device 30 or pFET device 40 will be formed to wrap around the fin 50. Source and drain regions (not specifically illustrated herein) of the nFET device 30 or the pFET device 40 are formed in extensions of the fin on opposite sides of their respective gate. The fin 50 itself serves as a channel. The effective channel length of the nFET device 30 or the pFET device 40 is determined by the dimensions of the fin 50.

FinFET devices offer several advantages over traditional Metal-Oxide Semiconductor Field Effect Transistor (MOSFET) devices (also referred to as planar devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

To fabricate a FinFET device, a gate replacement process or a hybrid gate replacement process may be used. However, traditional methods of fabricating FinFET devices may lead to undesirable gate compositions. In more detail, a FinFET device may have a polysilicon layer that constitutes a part of the gate. In many traditional FinFET devices, the polysilicon layer of the gate may have varying thicknesses, and this may adversely affect the performance of the FinFET device. To address this issue, the various aspects of the present disclosure involve forming a FinFET device having a polysilicon layer with a more constant thickness.

Referring to FIG. 1, the fins 50 are formed effectively as extensions of a semiconductor substrate 60. In the illustrated embodiment, the substrate 60 is a silicon substrate doped with a P-type dopant such as boron (for example a P-type substrate). In other embodiments, the substrate 60 could be another suitable semiconductor material. For example, the substrate 60 may be a silicon substrate that is doped with an N-type dopant such as phosphorous or arsenic (an N-type substrate). The substrate 60 may alternatively be made of some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, the substrate 60 could include an epitaxial layer (epi layer), may be strained for performance enhancement, or may include a silicon-on-insulator (SOI) structure.

Dielectric isolation features 70 such as shallow trench isolation (STI) features are formed in the substrate 60. The dielectric isolation features 70 are formed by etching recesses (or trenches) in the substrate 60 and filling the recesses with a dielectric material. In the present embodiment, the dielectric material of the dielectric isolation features 70 includes silicon oxide. In alternative embodiments, the dielectric material of the dielectric isolation features 70 may include silicon nitride, silicon oxy-nitride, fluoride-doped silicate (FSG), and/or a low-k dielectric material known in the art. In other embodiments, isolation structures such as deep trench isolation (DTI) features may be formed in the substrate 60 instead of, or in addition to, the dielectric isolation features 70.

The fins 50 are separated from one another and surrounded by the dielectric isolation features 70. In some embodiments, the fins 50 are formed by etching the dielectric isolation features 70 to reduce their height so that portions of the substrate 60 extend "above" the dielectric isolation features 70, thereby forming the fins 50. In other embodiments, instead of etching the dielectric isolation features 70, the substrate 60 may be epi-grown further to increase its height above the dielectric isolation features 70, thereby forming the fins 50.

A gate dielectric layer 100 is then formed over the fins 50. As is shown in FIG. 1, the gate dielectric layer 100 is formed to wrap around the fins 50. Portions of the gate dielectric layer 100 are also formed over the dielectric isolation features 70. The gate dielectric layer 100 is formed by an atomic layer deposition (ALD) process. In the illustrated embodiments, the gate dielectric layer 100 includes a high-k dielectric material. A high-k dielectric material is a material having a dielectric constant that is greater than a dielectric constant of $SiO_2$, which is approximately 4. In an embodiment, the gate dielectric layer 100 includes hafnium oxide ($HfO_2$), which has a dielectric constant that is in a range from approximately 18 to approximately 40. A capping metal layer (for example, TiN) may be disposed above the $HfO_2$ layer. In alternative embodiments, the gate dielectric layer 100 may include one of $ZrO_2$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, and SrTiO. It is understood that an interfacial layer may be optionally formed between the fins 50 and the gate dielectric layer 100. The interfacial layer may be formed by an ALD process and may include silicon oxide ($SiO_2$). For the sake of simplicity, the interfacial layer is not specifically illustrated herein.

A polysilicon layer 110 is then formed over the gate dielectric layer 100 in a conformal manner. In other words, the polysilicon layer 110 has a thickness 120 that does not vary substantially regardless of position. Thus, a segment of the polysilicon layer 110 located above the fin 50 and a segment of the polysilicon layer 110 located besides the fin and a segment of the polysilicon layer 110 located near a bottom of the fin all have approximately the same thickness 120. In some embodiments, the thickness 120 is greater than about 1 nanometer, for example in a range from about 5 nanometers to about 40 nanometers. The polysilicon layer 110 may be formed by an ALD process. In other embodiments, the polysilicon layer 110 may be formed by another suitable deposition process, such as CVD, physical vapor deposition (PVD), etc.

Thereafter, a layer 130 is formed on the polysilicon layer 110. In some embodiments, the layer 130 contains a dielectric material. The layer 130 has a material composition such that it will have a high etching selectivity with the polysilicon layer 110 in etching processes discussed below. Stated differently, the layer 130 and the polysilicon layer 110 have substantially different etching rates. In some embodiments, etching selectivity between the polysilicon layer 110 and the layer 130 can be greater than about 50:1 in dry etching processes, and greater than about 100:1 in wet etching processes. In some embodiments, the layer 130 contains silicon nitride.

The layer 130 is then patterned by a lithography process, which may involve one or more masking, exposing, baking, rinsing, and etching processes (not necessarily in that order). As a result of the lithography process, the layer 130 is patterned into a plurality of dummy gate electrode segments. The layer 130 may thereafter be referred to as dummy gate electrode segments 130, or vice versa. In other words, they may be interchangeably referred in this disclosure. A dimension 140 of these dummy gate electrode segments 130 helps define the dimension of the gate structures for the FinFET device 20 discussed herein. These dummy gate electrode segments 130 will eventually be removed, hence they are referred to as dummy gate electrode segments. Dielectric gate spacers 150 may be formed on the sidewalls of the dummy gate electrode segments 130. The gate spacers 150 and the layer 130 have different material compositions.

It is understood that a plurality of lightly doped source/drain (also referred to as LDD) regions may be formed in the fins 50. The LDD regions may be formed by an ion implantation process or a diffusion process known in the art. Similarly, heavily doped source/drain regions may be formed in the fins 50 as well. n-type dopants such as phosphorus or arsenic may be used to form nMOS devices, and p-type dopants such as boron may be used to form pMOS devices. One or more annealing processes may be performed to activate the source/drain regions. For reasons of simplicity, the LDD regions and the heavily doped source/drain regions are not specifically illustrated herein.

An inter-layer (or inter-level) dielectric (ILD) layer 200 is formed over the dielectric isolation features 70 and besides the dummy gate electrode segments 130. The ILD layer 200 may be formed by a deposition technique known in the art, for example CVD, high density plasma chemical vapor deposition (HDPCVD), ALD, spin-on, sputtering, or other suitable methods. The ILD layer 200 also contains a material that has a high etching selectivity with the polysilicon layer 110 in etching processes discussed below. In some embodiments, the etching selectivity between the polysilicon layer 110 and the ILD layer 200 can be greater than about 100:1. In some embodiments, the ILD layer 200 contains silicon oxide. It is also understood that the ILD layer 200 and the layer 130 have high etching selectivity as well, for example higher than about 30:1 or 40:1 in some embodiments. In alternative embodiments, the ILD layer 200 may include other suitable materials, such as silicon oxy-nitride, silicon carbide, or low-k materials. The ILD layer 200 may also be surrounded (wrapped around) by a barrier layer 210. In some embodiments, the barrier layer 210 is a contact etch stop layer (CESL).

A polishing process is performed on the ILD layer 200 and the layer 130 to planarize their upper surfaces. In some embodiments, the polishing process includes a chemical-mechanical-polishing (CMP) process.

Figure 2:
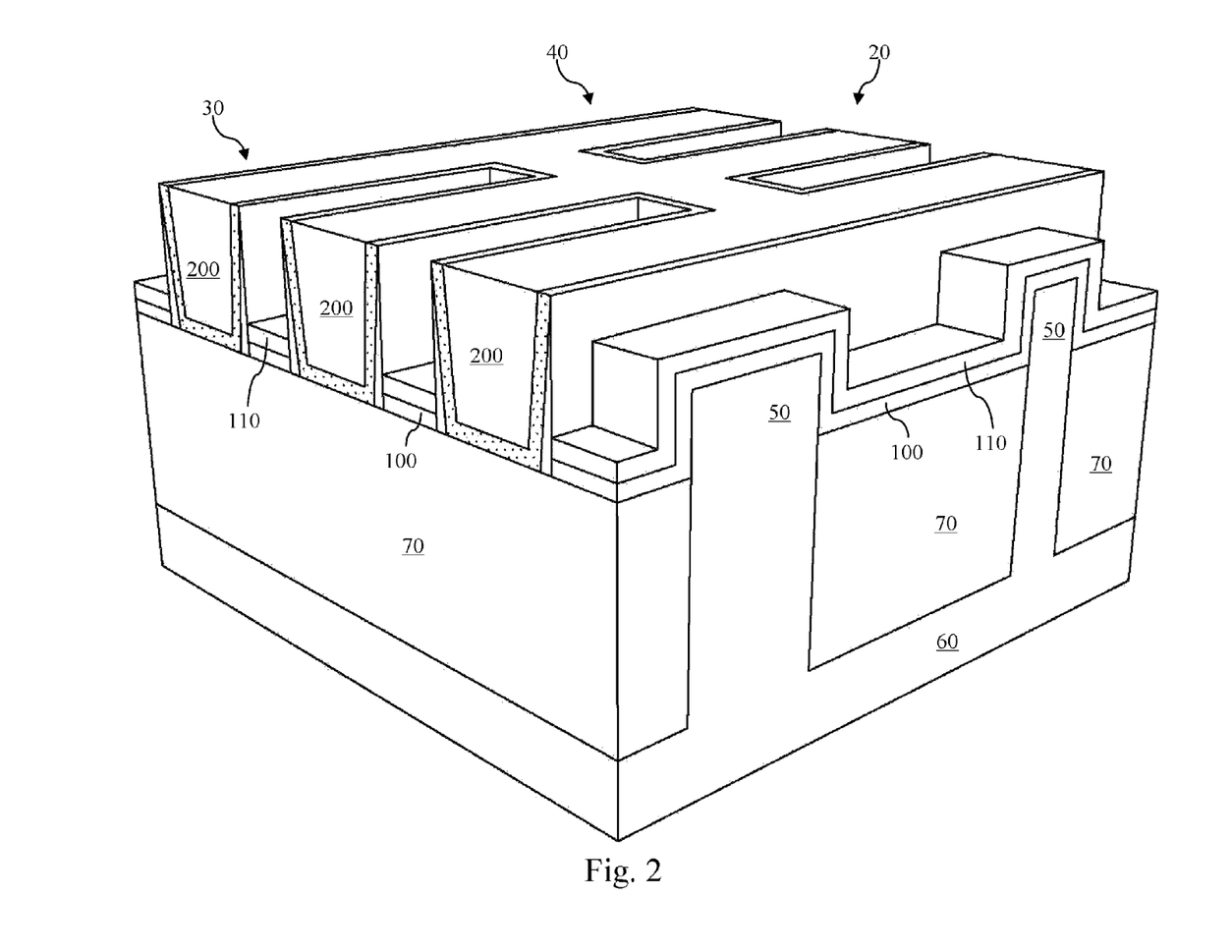

Referring now to FIG. 2, an etching process is performed to the FinFET device 20 to remove the layer 130. As discussed above, there is a high etching selectivity between the layer 130 and the polysilicon layer 110 for this etching process. Therefore, the polysilicon layer 110 is hardly affected by the etching process and the removal of the layer 130 thereabove. The etching process may be either a dry etching process or a wet etching process known in the art.

Figure 3:
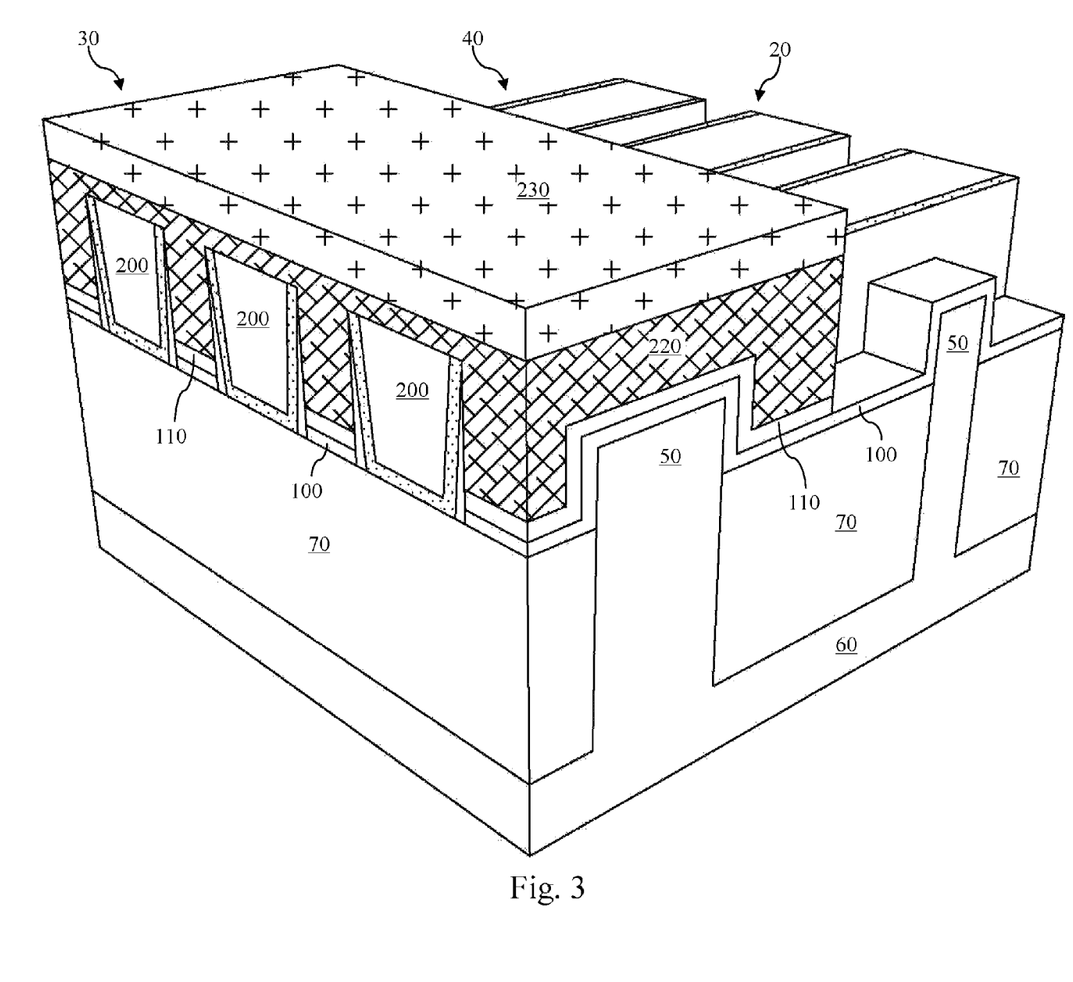

Referring now to FIG. 3, a layer 220 is formed over the polysilicon layer 110. The layer 220 contains a material suitable for planarization and etch. In some embodiments, the layer 220 contains a spin-on-glass (SOG) material. In some embodiments, the layer 220 is an anti-reflective layer, for example a bottom anti-reflective coating (BARC) layer. A patterned photoresist mask 230 is then formed over the layer 220. The photoresist mask 230 is formed over the nFET device 30 but not over the pFET device 40. With the photoresist mask 230 serving as an etching mask, an etching process is then performed to remove portions of the polysilicon layer 110 in the region of the pFET device 40. In other words, the polysilicon layer 110 for the pFET device 40 is removed, while the polysilicon layer 110 for the nFET device 30 remains intact because it is protected by the photoresist mask 230 during the etching process. As discussed above, due to the high etching selectivity between the polysilicon layer 110 and the ILD layer 200, the ILD layer 200 is substantially unaffected by the etching process and the removal of the polysilicon layer 110 in the region of the pFET device 40. It is understood, however, that the above processes may be applied with a reversed nFET and pFET configuration. For example, the fabrication processes may be carried out so that the polysilicon layer for the nFET device is removed, while the polysilicon layer for the pFET device remains intact.

Figure 4:
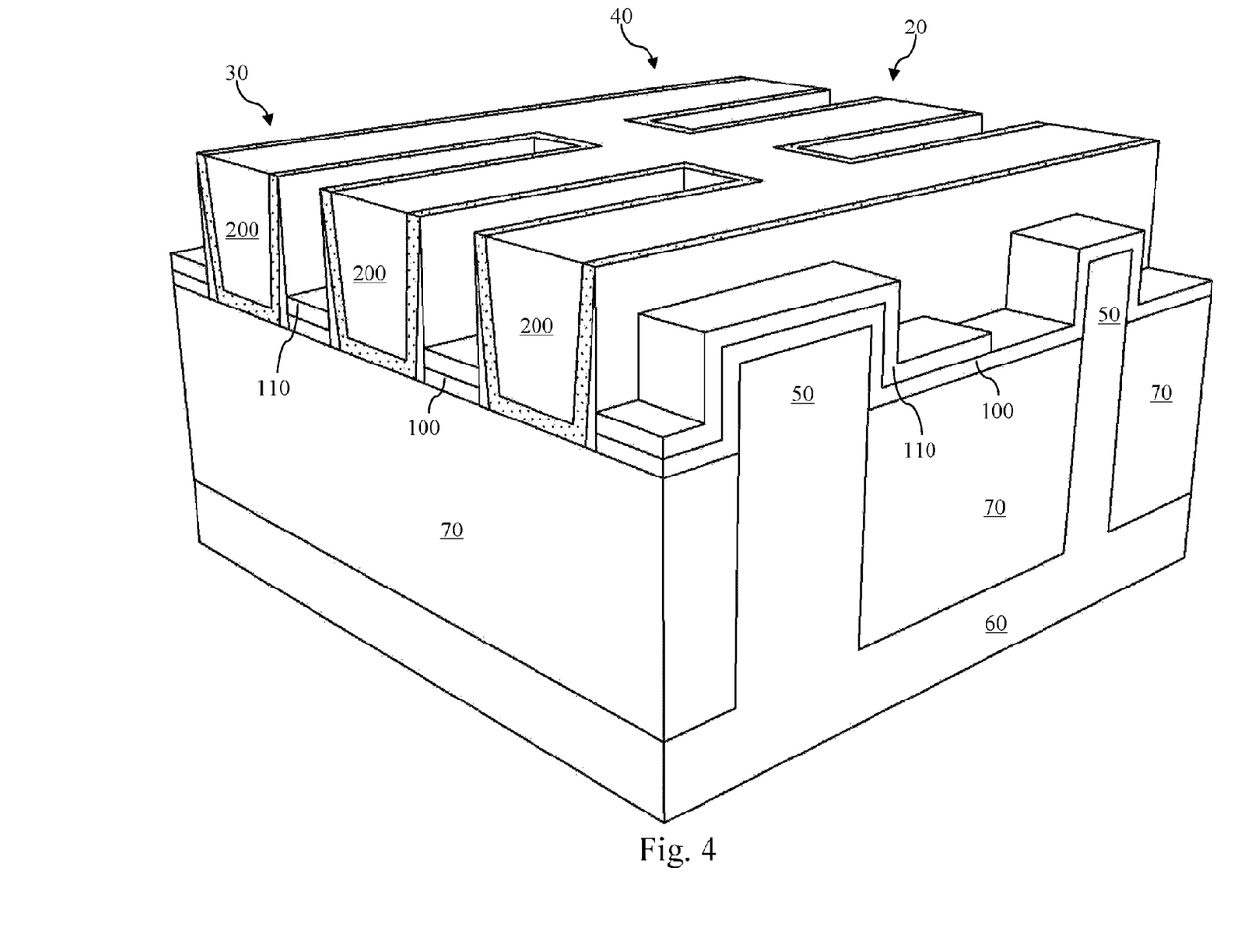

Referring now to FIG. 4, the layer 220 and the photoresist mask 230 are removed, thereby exposing the polysilicon layer 110 in the region of the nFET device 30. The removal process may include a stripping or an ashing process.

Figure 5:
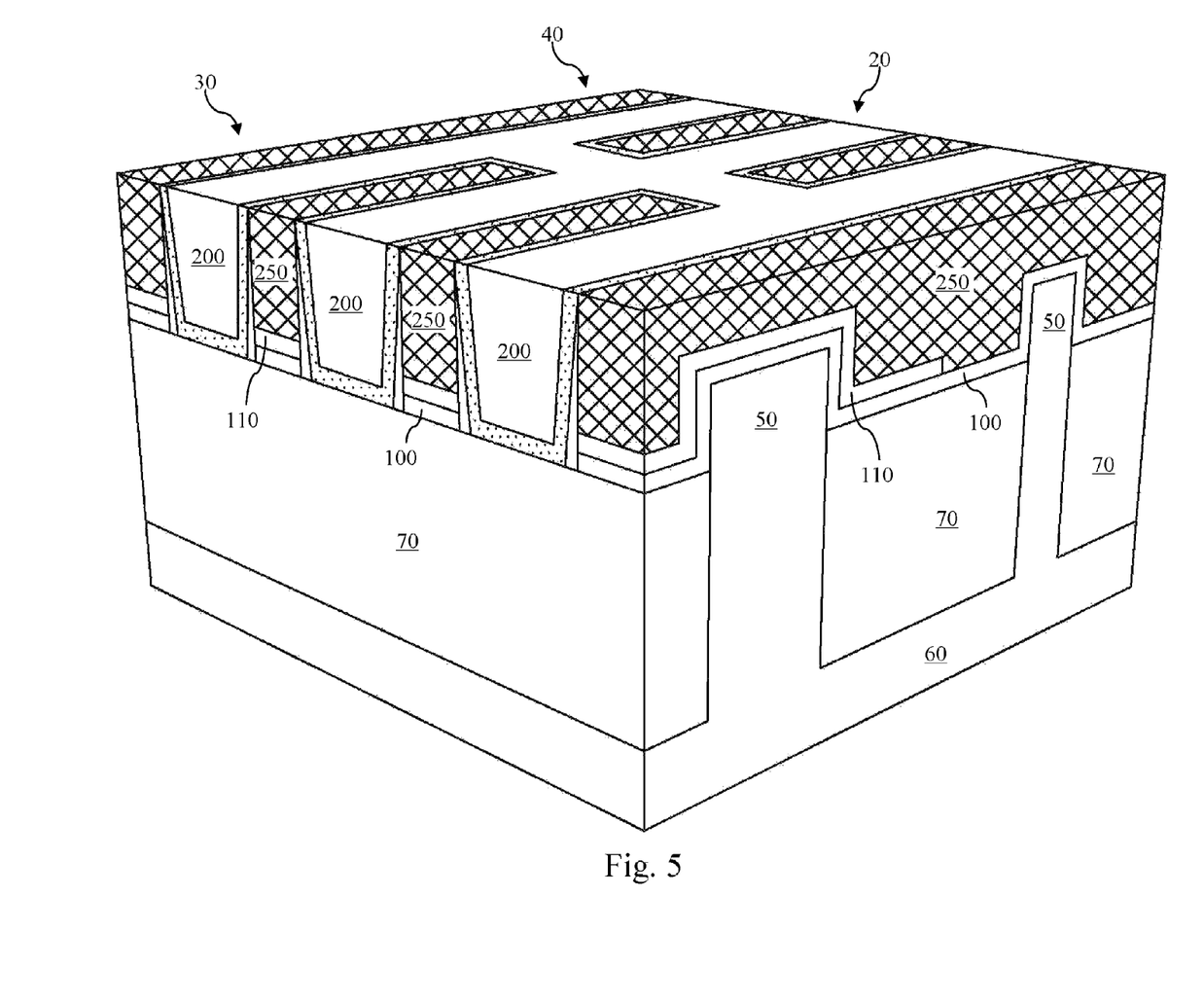

Referring now to FIG. 5, a metal gate electrode layer 250 is formed in place of (or to replace) the layer 130 (i.e., the dummy gate electrodes). The metal gate electrode layer 250 may be formed by a plurality of deposition processes, such as CVD, PVD, ALD, or plating, followed by a polishing process, such as a CMP process. The metal gate electrode layer 250 may include a work function metal portion, which tunes a work function of its corresponding transistor to achieve a desired threshold voltage $V_t$. In some embodiments, the work function metal portion includes at least one of: TiN, TaN, TaC, TaSiN, WN, TiAl, TiAlN, or combinations thereof. The work function metal portion may alternatively include other metal materials that are suitable for application or manufacturing considerations. The metal gate electrode layer 250 may also include a metal portion that serves as the main conductive portion of the gate electrode layer 250, which may be referred to as a fill metal portion. In some embodiments, the fill metal portion may include at least one of Tungsten (W), Aluminum (Al), Copper (Cu), and combinations thereof. For reasons of simplicity, the work function metal portion and the fill metal portion are not separately illustrated herein. It is also understood that the metal gate electrode layer may include portions that serve other functions, such as blocking layers and glue layers, etc.

The polysilicon layer 110 in the nFET device 30 also serves as a portion of the gate electrode for the nFET device. Therefore, the nFET device 30 may be said to have a composite gate. Since the polysilicon layer 110 is conformally formed over the gate dielectric layer 100, the thickness of the polysilicon layer 110 remains substantially constant across different regions of the fin 50, for example above the fin 50 or besides the fin 50. In comparison, other methods of forming FinFET devices may not be able to achieve a substantially constant thickness for the polysilicon layer. In particular, a portion of the polysilicon layer above the fin may be much narrower than a portion of the polysilicon layer besides the fin or near the bottom of the fin. The conformal polysilicon layer 110 disclosed herein allows for better performing and more stable FinFET devices. Furthermore, due at least in part to the high etching selectivity between the polysilicon layer 110 and the ILD layer 200 and the layer 130, the upper surface of the polysilicon layer 110 can remain substantially flat during the various processing stages. The flat surface of the polysilicon layer 110 also helps improve the performance of the nFET device 30. In addition, the composite gate including the polysilicon layer 110 offers benefits relating to multi-gate channel stress.

It is understood that additional processes may be performed to complete the fabrication of the FinFET device 20. For example, these additional processes may include deposition of passivation layers, formation of contacts, and formation of interconnect structures (e.g., lines and vias, metal layers, and interlayer dielectric that provide electrical interconnection to the device including the formed metal gate). For the sake of simplicity, these additional processes are not described herein.

The embodiments discussed above with reference to FIGS. 1-5 illustrate one suitable approach for a hybrid gate replacement fabrication process. With reference to FIGS. 1 and 6-9, an alternative approach for a hybrid gate replacement fabrication process is illustrated. For purposes of clarity and consistency, similar components in these two approaches are labeled the same throughout FIGS. 1-9.

With reference to FIG. 1, the alternative fabrication approach also involves forming the fins 50, forming the gate dielectric layer 100, forming the dummy gate electrode segments 130, and forming the ILD layer 200. A polishing process is performed on the ILD layer 200 and the dummy gate electrode segments 130 to planarize their upper surfaces.

Figure 6:
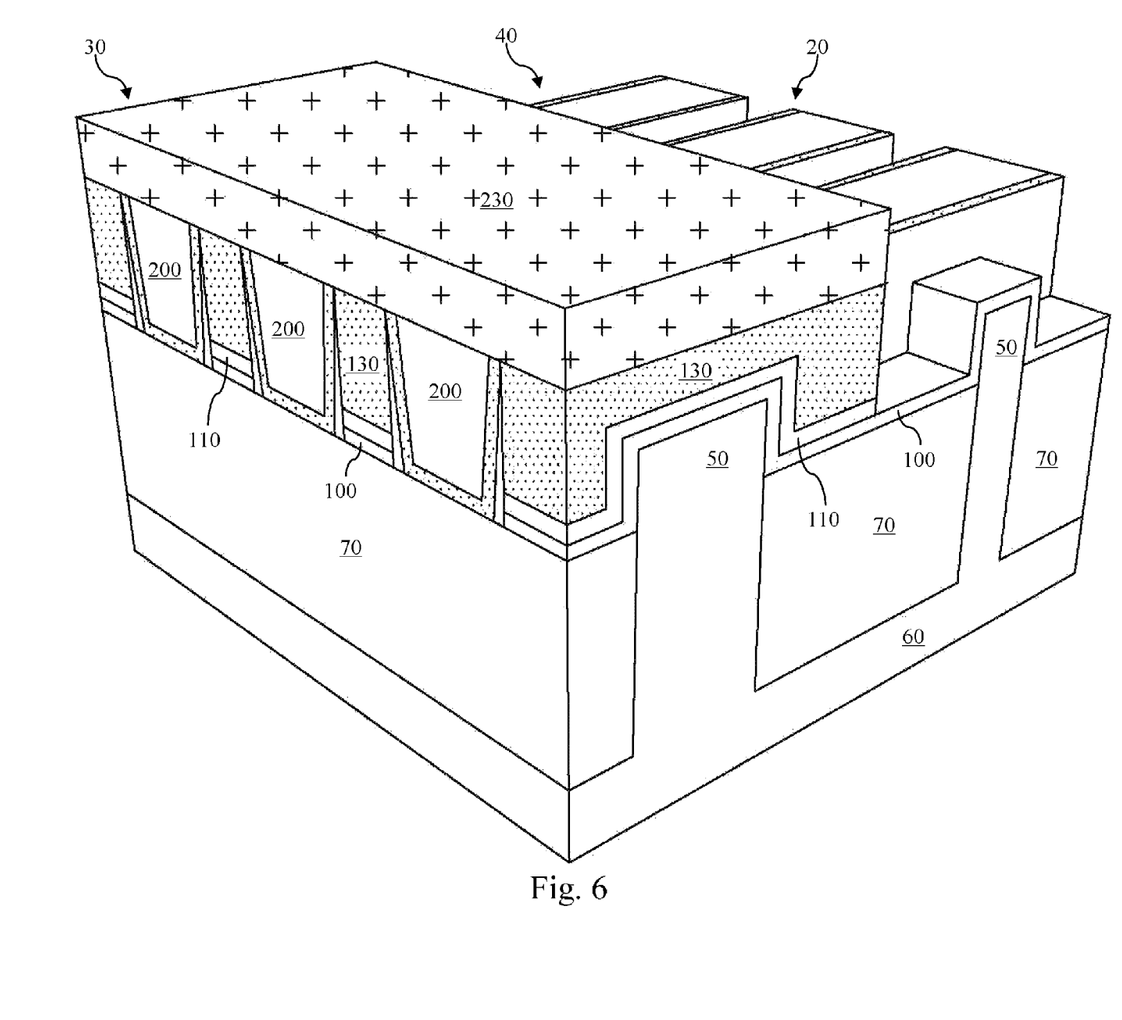

Referring now to FIG. 6, rather than removing all of the dummy gate electrode segments 130, a photoresist mask 230 is formed in the region of the nFET device 30 instead. An etching process is then performed to the FinFET device 20 while using the photoresist mask 230 as an etching mask. Hence, the dummy gate electrode segments 130 in the region of the pFET device 40 are removed by the etching process, while the dummy gate electrode segments 130 in the region of the nFET device 30 are unaffected by the etching process and thus still remain on the polysilicon layer 110 in the nFET device 30. Also, due to the high etching selectivity between the polysilicon layer 110 and the ILD layer 100, the ILD layer is substantially unaffected by the etching process and the removal of the polysilicon layer 110.

Figure 7:
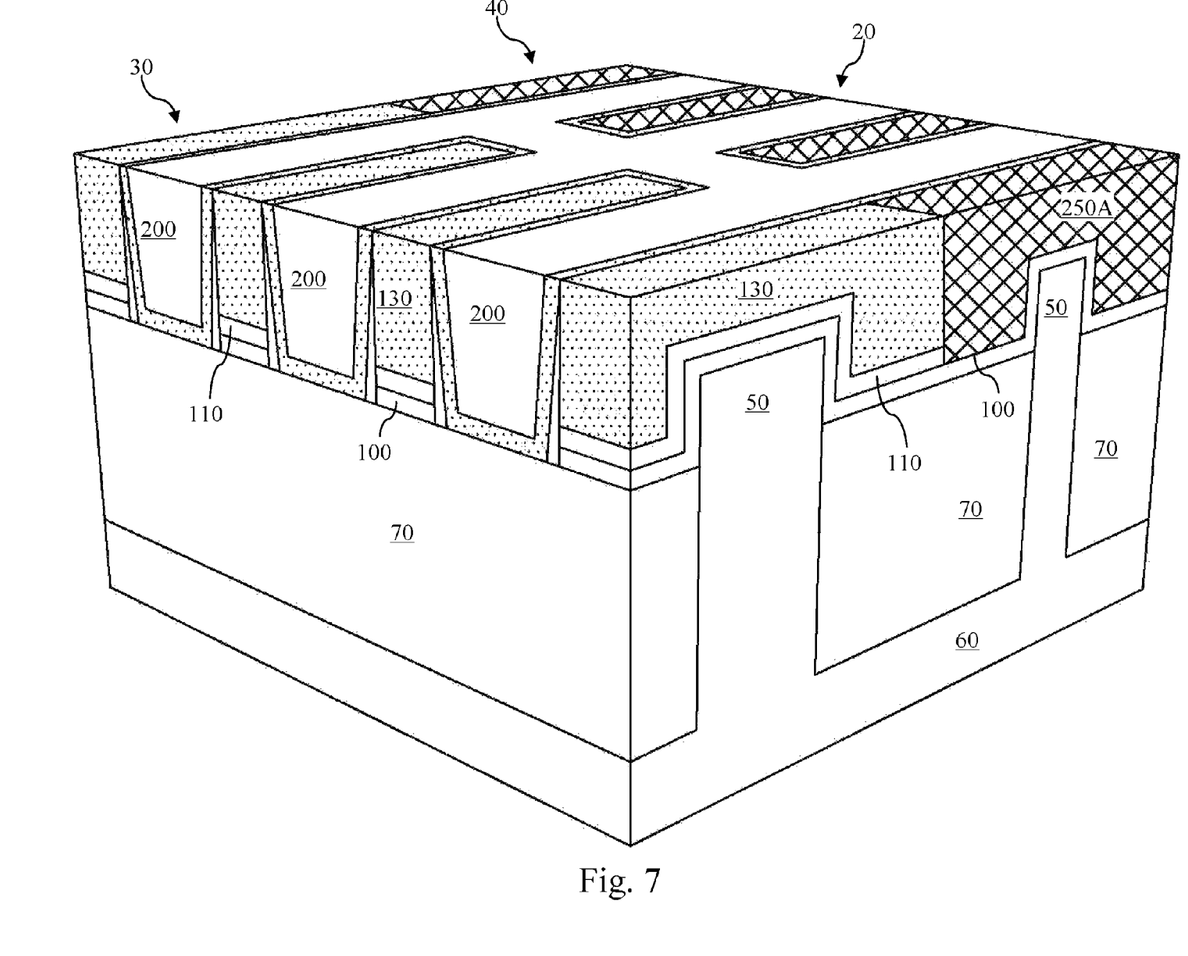

Referring now to FIG. 7, a metal gate electrode layer 250A is formed in place of (or to replace) the dummy gate electrode segments 130 in the pFET device 40. As is the case for the metal gate electrode layer 250 shown in FIG. 5, the metal gate electrode layer 250A may be formed by a suitable deposition process and may include a work function metal portion and a fill metal portion. The work function metal portion and the fill metal portion (as well as any other additional portions) of the metal gate electrode layer 250A may include substantially the same materials discussed above with reference to the metal gate electrode layer 250.

Figure 8:
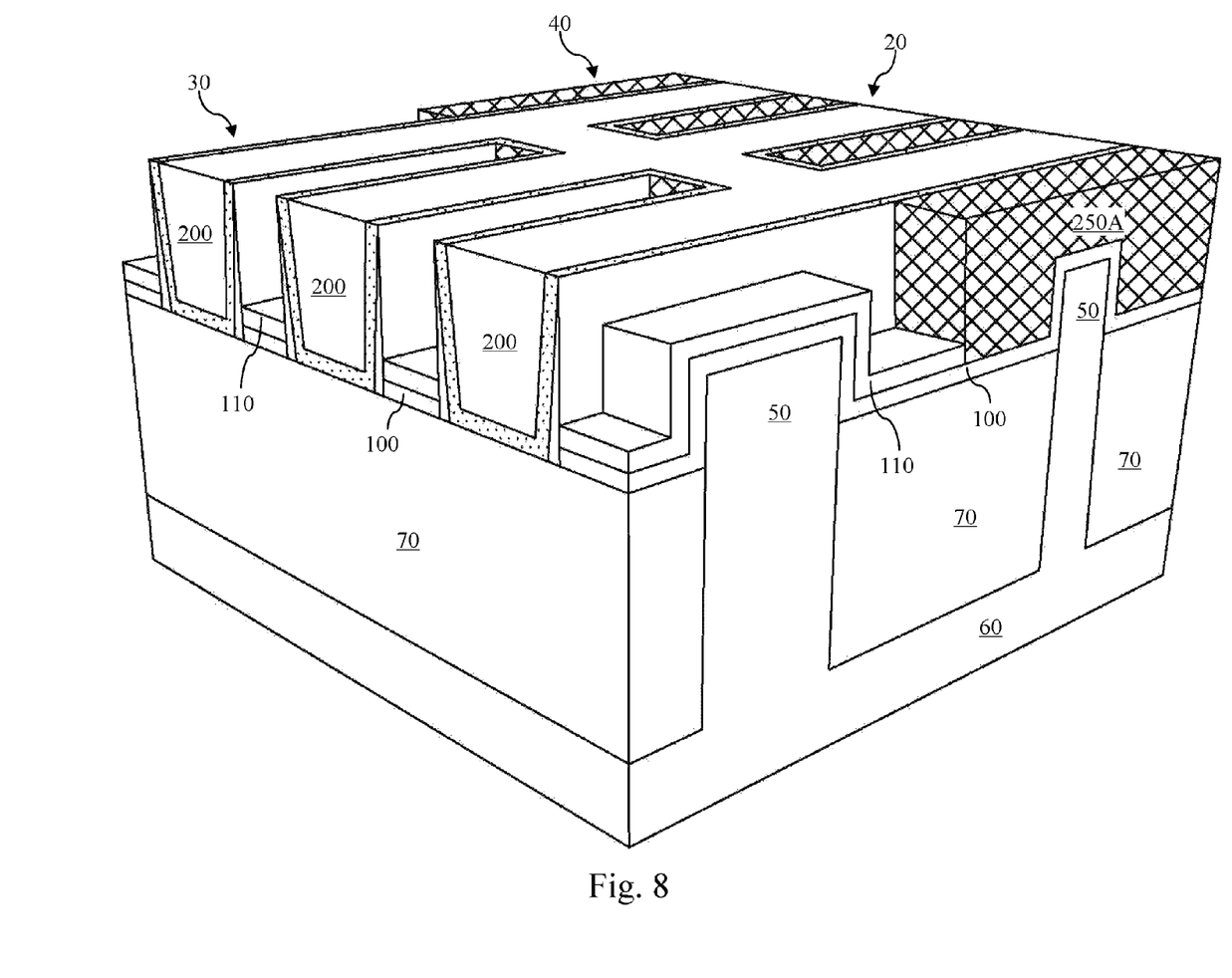

Referring now to FIG. 8, the dummy gate electrode segments 130 in the region of the nFET device 30 are removed in an etching process, thereby exposing the polysilicon layer 110 in the nFET device 30. As discussed above, there is a high etching selectivity between the polysilicon layer 110 and the ILD layer 200 and the dielectric material of the dummy gate electrode segments 130. Therefore, the removal of the dummy gate electrode segments 130 has no substantial impact on the ILD layer 200 or the polysilicon layer 110. The upper surface of the polysilicon layer 110 in the nFET device 30 remains flat, and its thickness is still substantially constant in different regions around the fin 50 (for example above the fin 50 and near the bottom of the fin 50). Also, with respect to this etching process, there is a high etching selectivity between the dummy gate electrode segments 130 and the metal gate electrode layer 250A. Thus, the metal gate electrode layer 250A remains substantially unaffected by the etching process and the removal of the dummy gate electrode segments 130.

Figure 9:
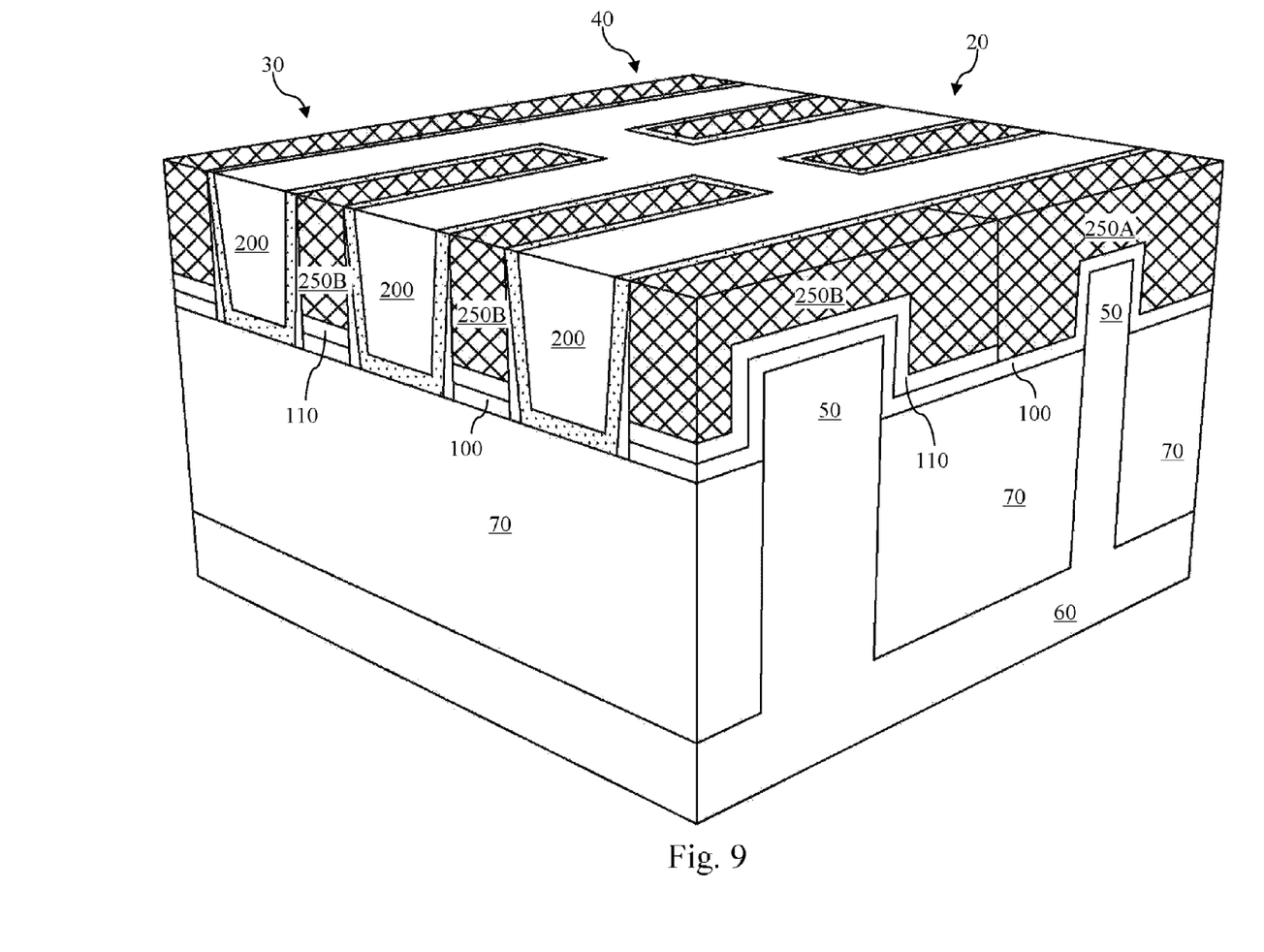

Referring now to FIG. 9, a metal gate electrode layer 250B is formed in place of (or to replace) the dummy gate electrode segments in the nFET device 30. As is the case for the metal gate electrode layer 250 shown in FIG. 5, the metal gate electrode layer 250B may be formed by a suitable deposition process and may include a work function metal portion and a fill metal portion. The work function metal portion and the fill metal portion of the metal gate electrode layer 250B may include substantially the same materials as those discussed above with reference to the metal gate electrode layer 250. Once again, the polysilicon layer 110 in the nFET device 30 constitutes a part of the composite gate structure for the nFET device 30, and the fact that the polysilicon layer 110 has a substantially constant thickness helps improve the performance of the nFET device 30. In addition, the composite gate including the polysilicon layer 110 offers benefits relating to multi-gate channel stress. It is understood that in alternative embodiments, a silicide approach may also be used, in which metal silicide is formed as polysilicon reacts with a metal layer (e.g., n-metal).

Figure 10:
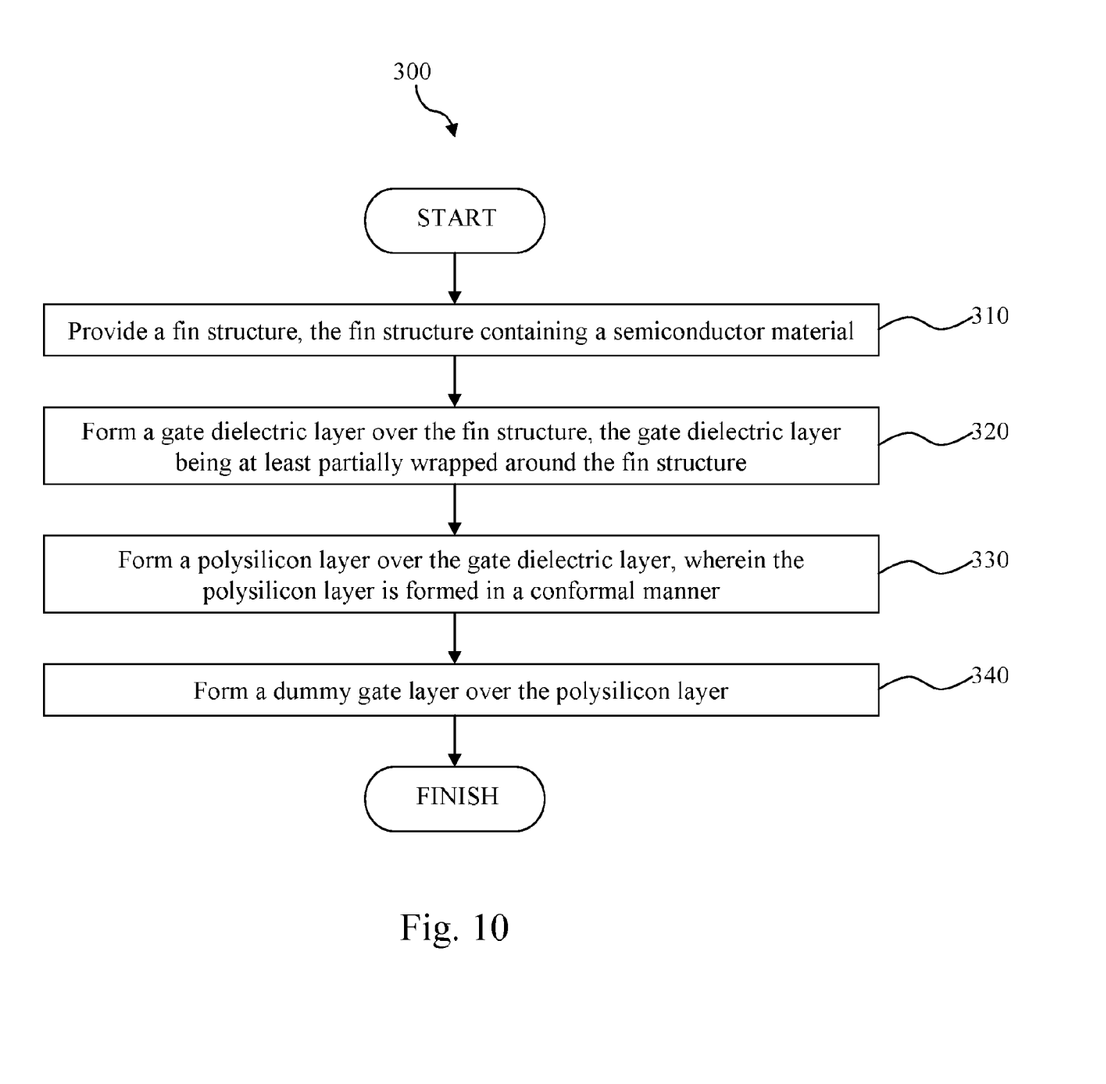
FIG. 10 is a flowchart illustrating a method of fabricating a semiconductor device according to various aspects of the present disclosure.

FIG. 10 is a flowchart of a method 300 for fabricating a FinFET device according to various aspects of the present disclosure. The method includes step 310 in which a fin structure is provided. The fin structure contains a semiconductor material. The method 300 includes a step 320 in which a gate dielectric layer is formed over the fin structure. The gate dielectric layer is at least partially wrapped around the fin structure. The method 300 includes a step 330 in which a polysilicon layer is formed over the gate dielectric layer. The polysilicon layer is formed in a conformal manner. The method 300 includes a step 340 in which a dummy gate layer is formed over the polysilicon layer. It should be noted that additional processes may be provided before, during, and after the method 300 of FIG. 10, and that some other processes may only be briefly described herein.

One of the broader forms of the present disclosure involves a semiconductor device. The semiconductor device includes: a transistor that includes: a semiconductor layer disposed over a substrate, the semiconductor layer having a fin-like structure; a gate dielectric layer wrapped around at least a portion of the semiconductor layer; a polysilicon layer disposed over the gate dielectric layer in a conformal manner; and a metal gate electrode layer disposed over the polysilicon layer.

In some embodiments, the polysilicon layer has a substantially constant thickness.

In some embodiments, the transistor is an n-type FinFET device.

In some embodiments, the semiconductor device further including a p-type FinFET device disposed adjacent to the n-type FinFET device, wherein the p-type FinFET device is free of a polysilicon layer.

In some embodiments, at least a portion of the gate dielectric layer is formed on a dielectric isolation feature.

In some embodiments, the gate dielectric layer, the polysilicon layer, and the metal gate electrode layer are collectively disposed besides an interlayer dielectric (ILD) layer.

In some embodiments, the gate dielectric layer includes a high-k dielectric material.

Another one of the broader forms of the present disclosure involves a method of fabricating a FinFET semiconductor device. The FinFET semiconductor device includes: a fin structure formed over a substrate; a gate dielectric layer that at least partially wraps around a segment of the fin structure, the gate dielectric layer containing a high-k gate dielectric material; a polysilicon layer conformally formed on the gate dielectric layer; and a metal gate electrode layer formed over the polysilicon layer.

In some embodiments, a thickness of a segment of the polysilicon layer located above the gate dielectric layer is substantially the same as a thickness of a segment of the polysilicon layer located near a bottom of the fin structure.

In some embodiments, the FinFET semiconductor device is an n-type FinFET.

In some embodiments, the FinFET semiconductor device is disposed adjacent to a p-type FinFET that includes a gate dielectric layer and a metal gate electrode layer, but does not include a polysilicon layer.

In some embodiments, the substrate contains a dielectric isolation feature; the fin structure extends above the dielectric isolation feature; and the gate dielectric layer is partially located over the dielectric isolation feature.

In some embodiments, the FinFET semiconductor device further includes an interlayer dielectric (ILD) layer that is located adjacent to the gate dielectric layer, the polysilicon layer, and the metal gate electrode layer.

Yet another of the broader forms of the present disclosure involves a method of fabricating a FinFET device. The method includes: providing a fin structure, the fin structure containing a semiconductor material; forming a gate dielectric layer over the fin structure, the gate dielectric layer being at least partially wrapped around the fin structure; forming a polysilicon layer over the gate dielectric layer, wherein the polysilicon layer is formed in a conformal manner; and forming a dummy gate layer over the polysilicon layer.

In some embodiments, a thickness of a segment of the polysilicon layer located above the gate dielectric layer is approximately equal to a thickness of a segment of the polysilicon layer located near a bottom of the fin structure.

In some embodiments, the gate dielectric layer contains a high-k dielectric material.

In some embodiments, the method further includes: patterning the dummy gate layer to define a plurality of dummy gates; filling spaces between the dummy gates with an interlayer dielectric (ILD) layer; and planarizing the dummy gates and the ILD layer with a polishing process.

In some embodiments, the method further includes: removing the dummy gates to expose the polysilicon layer through an etching process, wherein a high etching selectivity exists between the polysilicon layer and the dummy gates; and forming a plurality of metal gate electrodes over the polysilicon layer.

In some embodiments, the dummy gate layer includes a silicon nitride material; and the ILD layer includes a silicon oxide material.

In some embodiments, the FinFET device is an n-type FinFET device.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor device, comprising:
   a semiconductor layer disposed over a substrate, the semiconductor layer having a first fin-like structure and a second fin-like structure;
   a gate dielectric layer wrapped around at least a portion of both the first fin-like structure and the second fin-like structure on the semiconductor layer;
   a gate layer disposed over and in contact with the gate dielectric layer over the first fin-like structure in a substantially conformal manner, wherein the gate layer has a substantially constant thickness, wherein the gate layer does not extend over the second fin-like structure; and
   a metal gate layer disposed over the gate layer and the second fin-like structure, the metal gate layer being in direct contact with the gate dielectric layer over the second fin-like structure
   an interlayer dielectric layer feature disposed adjacent the metal gate layer, the interlayer dielectric layer formed over the first fin-like structure and the second fin-like structure, wherein the interlayer dielectric feature comprises:
      an elongated portion, the elongated portion being positioned between and running parallel to the first fin-like structure and the second fin-like structure; and
      a set of perpendicularly extending portions that extend perpendicular from the elongated portion, the perpendicularly extending portions extending over the first fin-like structure and the second fin-like structure.

2. The semiconductor device of claim 1, wherein the first fin-like structure is part of an n-type FinFET device.

3. The semiconductor device of claim 1, wherein the second fin-like structure is part of a p-type FinFET device.

4. The semiconductor device of claim 1, wherein at least a portion of the gate dielectric layer is formed on a dielectric isolation feature.

5. The semiconductor device of claim 1, wherein the gate dielectric layer, the gate layer, and the metal gate layer are collectively disposed besides an interlayer dielectric (ILD) layer.

6. The semiconductor device of claim 1, wherein the gate dielectric layer includes a high-k dielectric material.

7. The semiconductor device of claim 1, wherein the gate layer comprises polysilicon.

8. A FinFET semiconductor device, comprising:
   a first fin structure formed over a substrate;
   a second fin structure formed over the substrate;
   a gate dielectric layer that at least partially wraps around both a segment of the first fin structure and a segment of the second fin structure, the gate dielectric layer containing a high-k gate dielectric material;
   a gate layer substantially conformally formed on the gate dielectric layer over the first fin structure, wherein a thickness of a segment of the gate layer located above the fin structure is substantially the same as a thickness of a segment of the gate layer located near a bottom of the fin structure, wherein the gate layer does not extend over the second fin structure;
   a metal gate layer formed over the gate layer and the second fin structure; and
   an interlayer dielectric layer feature adjacent the metal gate layer, the interlayer dielectric feature formed over the first fin-like structure and the second fin-like structure, wherein the interlayer dielectric feature comprises:
      an elongated portion, the elongated portion being positioned between and running parallel to the first fin-like structure and the second fin-like structure; and
      a set of perpendicularly extending portions that extend perpendicular from the elongated portion, the perpendicularly extending portions extending over the first fin-like structure and the second fin-like structure.

9. The FinFET semiconductor device of claim 8, wherein the first fin structure of the FinFET semiconductor device is part of an n-type FinFET.

10. The FinFET semiconductor device of claim 8, wherein the second fin structure of the FinFET semiconductor device is part of a p-type FinFET.

11. The FinFET semiconductor device of claim 8, wherein:
   the gate dielectric layer is partially located over the dielectric isolation feature.

12. The FinFET semiconductor device of claim 8, further including an interlayer dielectric (ILD) layer that is located adjacent to the gate dielectric layer, the gate layer, and the metal gate layer.

13. The FinFET semiconductor device of claim 8, wherein the gate layer comprises polysilicon.

14. A semiconductor device comprising:
   a substrate;
   a first fin-like structure formed on the substrate;
   a second fin-like structure formed on the substrate;
   a gate dielectric layer formed over both the first fin-like structure and the second fin-like structure;
   a gate layer formed over a portion of the gate dielectric layer that is over the first fin-like structure, the gate layer having a substantially constant thickness;
   a first metal gate formed over the gate layer;
   a second metal gate in electrical connection with the first metal gate, the second metal gate being formed over and in direct contact with the gate dielectric layer formed over the second fin-like structure; and
   an interlayer dielectric layer feature adjacent the first metal gate and the second metal gate, the interlayer dielectric feature formed over the first fin-like structure and the second fin-like structure, the interlayer dielectric feature comprising:
      an elongated portion, the elongated portion being positioned between and running parallel to first fin-like structure and the second fin-like structure; and
      a set of perpendicularly extending portions that extend perpendicular from the elongated portion, the perpendicularly extending portions extending over the first fin-like structure and the second fin-like structure.

15. The device of claim 14, wherein the second metal gate has a different work function than the first metal gate.

16. The device of claim 14, wherein the second fin-like structure is part of a pFET device.

17. The device of claim 14, wherein the first fin-like structure is part of an nFET device.

18. The device of claim 14, wherein the gate layer has a thickness greater than one nanometer.

19. The device of claim 14, wherein the gate layer has a thickness within a range of about 5 to 40 nanometers.

20. The device of claim 14, wherein the gate layer comprises polysilicon.

* * * * *